(12) United States Patent
Kobayashi

(10) Patent No.: US 10,714,368 B2
(45) Date of Patent: Jul. 14, 2020

(54) CEILING TRANSPORT VEHICLE SYSTEM AND TEACHING UNIT

(71) Applicant: MURATA MACHINERY, LTD., Kyoto-shi, Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/491,595

(22) PCT Filed: Feb. 14, 2018

(86) PCT No.: PCT/JP2018/005067
§ 371 (c)(1),
(2) Date: Sep. 6, 2019

(87) PCT Pub. No.: WO2018/186021
PCT Pub. Date: Oct. 11, 2018

(65) Prior Publication Data
US 2020/0020559 A1 Jan. 16, 2020

(30) Foreign Application Priority Data
Apr. 6, 2017 (JP) .................................. 2017-076207

(51) Int. Cl.
*H01L 21/677* (2006.01)
*H01L 21/68* (2006.01)
(Continued)

(52) U.S. Cl.
CPC .......... *H01L 21/67733* (2013.01); *B61B 3/02* (2013.01); *G05B 19/423* (2013.01); *H01L 21/673* (2013.01); *H01L 21/677* (2013.01); *H01L 21/6773* (2013.01); *H01L 21/67706* (2013.01); *H01L 21/67721* (2013.01);
(Continued)

(58) Field of Classification Search
CPC ........ H01L 21/67733; H01L 21/67721; H01L 21/67766; H01L 21/6773; H01L 21/673; H01L 21/67775; H01L 21/67706; H01L 21/677; H01L 21/68; H01L 21/67736; H01L 21/67259; G05B 19/423
See application file for complete search history.

(56) References Cited

U.S. PATENT DOCUMENTS

2007/0158291 A1* 7/2007 Campbell ......... H01L 21/68707
212/327
2016/0196994 A1* 7/2016 Chang ............... H01L 21/67727
414/806
(Continued)

FOREIGN PATENT DOCUMENTS

JP 3479969 B2 12/2003

*Primary Examiner* — Ronald D Hartman, Jr.
(74) *Attorney, Agent, or Firm* — Keating & Bennett, LLP

(57) ABSTRACT

An overhead transport vehicle system includes an overhead transport vehicle to convey an object, and a teaching unit to teach transfer of the object by the overhead transport vehicle to a load port on which the object is to be placed. The teaching unit includes a body including a detector to be brought into contact with a positioning pin on the load port to detect a position of the positioning pin, and a flange movable up and down with respect to the body and to be held by a holder to be raised and lowered by an elevator of the overhead transport vehicle.

8 Claims, 10 Drawing Sheets

(51) Int. Cl.
  *H01L 21/673* (2006.01)
  *G05B 19/423* (2006.01)
  *B61B 3/02* (2006.01)
(52) U.S. Cl.
  CPC .. *H01L 21/67766* (2013.01); *H01L 21/67775* (2013.01); *H01L 21/68* (2013.01)

(56) References Cited

U.S. PATENT DOCUMENTS

| | | | |
|---|---|---|---|
| 2017/0186639 A1* | 6/2017 | Takai | H01L 21/67733 |
| 2017/0200625 A1* | 7/2017 | Takai | H01L 21/67736 |
| 2017/0200626 A1* | 7/2017 | Takai | H01L 21/67736 |
| 2018/0019146 A1* | 1/2018 | Huang | H01L 21/67259 |
| 2019/0378734 A1* | 12/2019 | Ehrne | H04B 5/0031 |
| 2020/0010280 A1* | 1/2020 | Abe | H01L 21/67775 |
| 2020/0013652 A1* | 1/2020 | Kobayashi | B66C 19/00 |

* cited by examiner

Fig.1
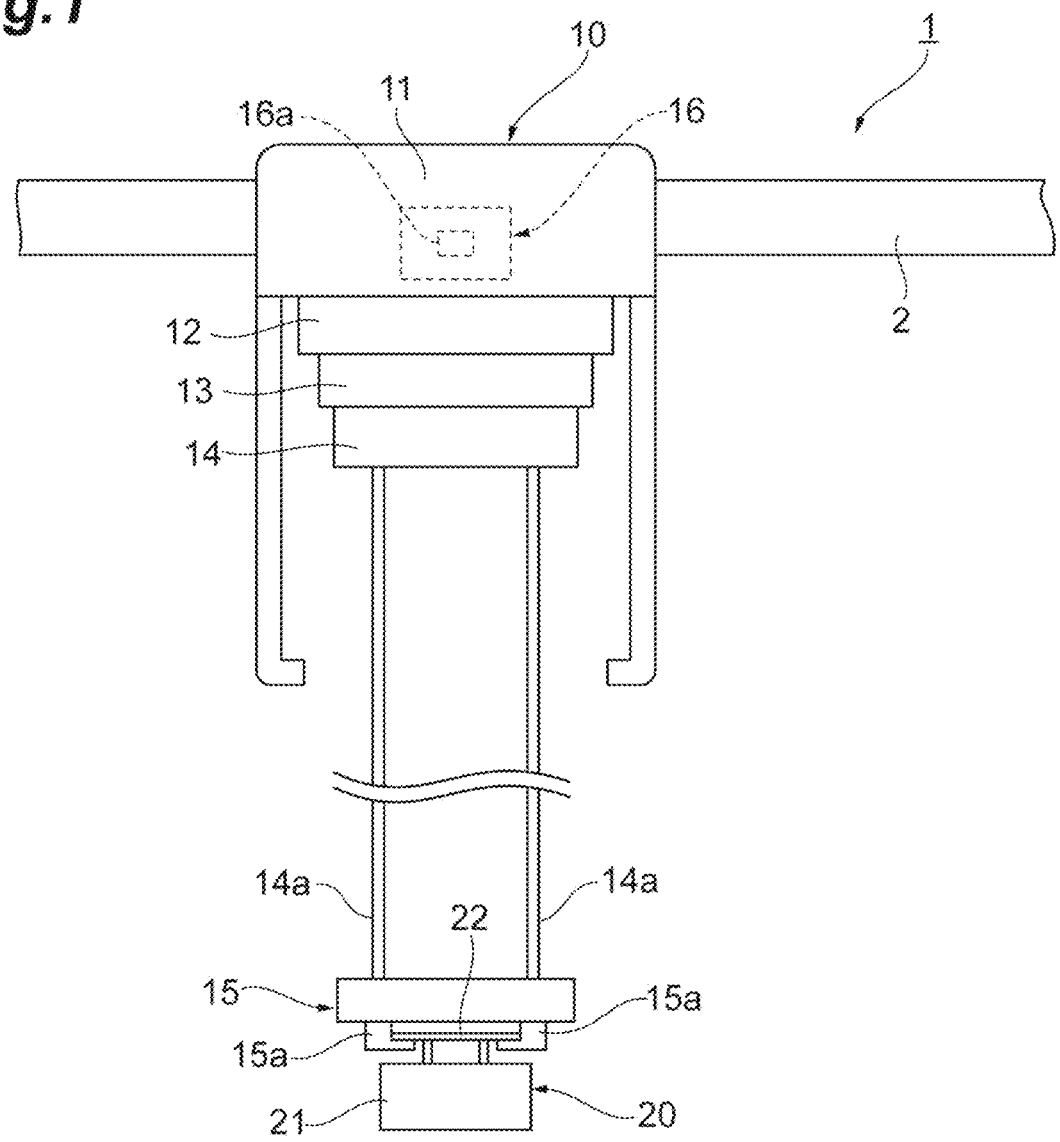
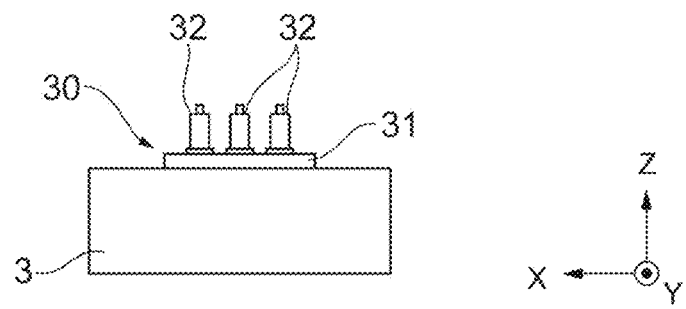

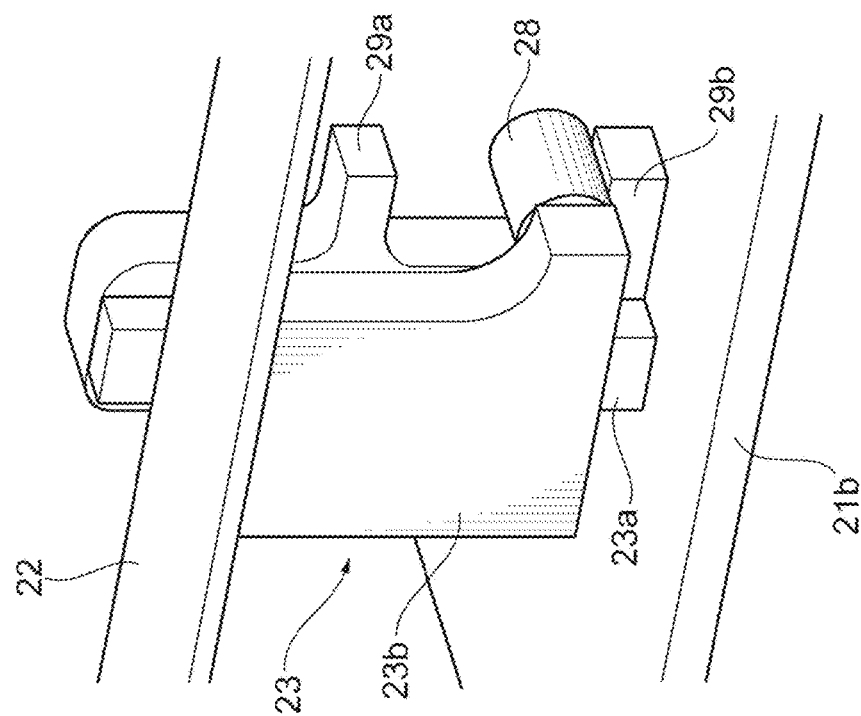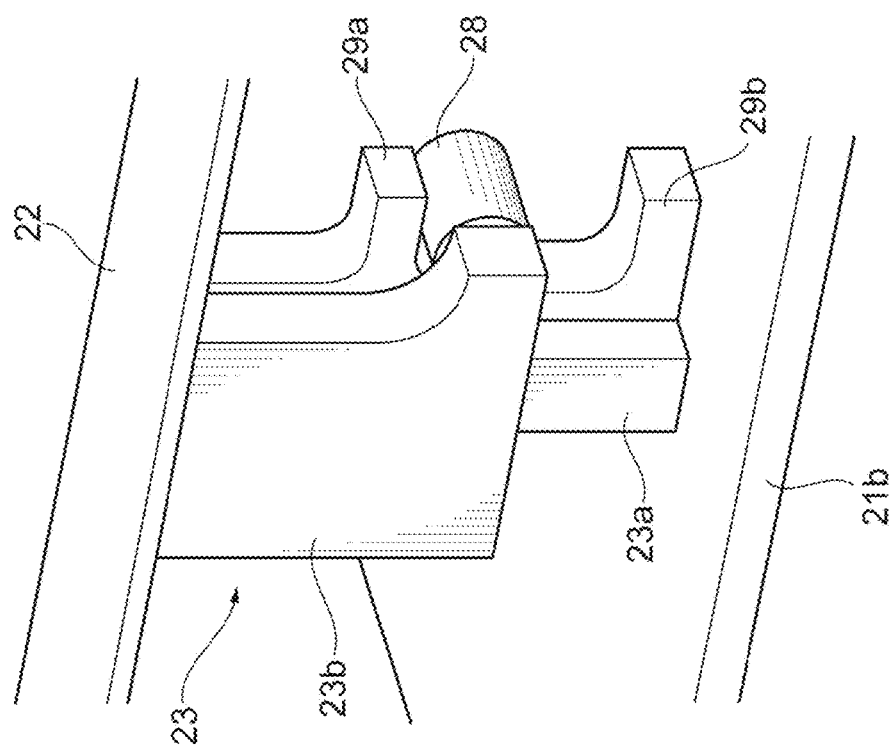

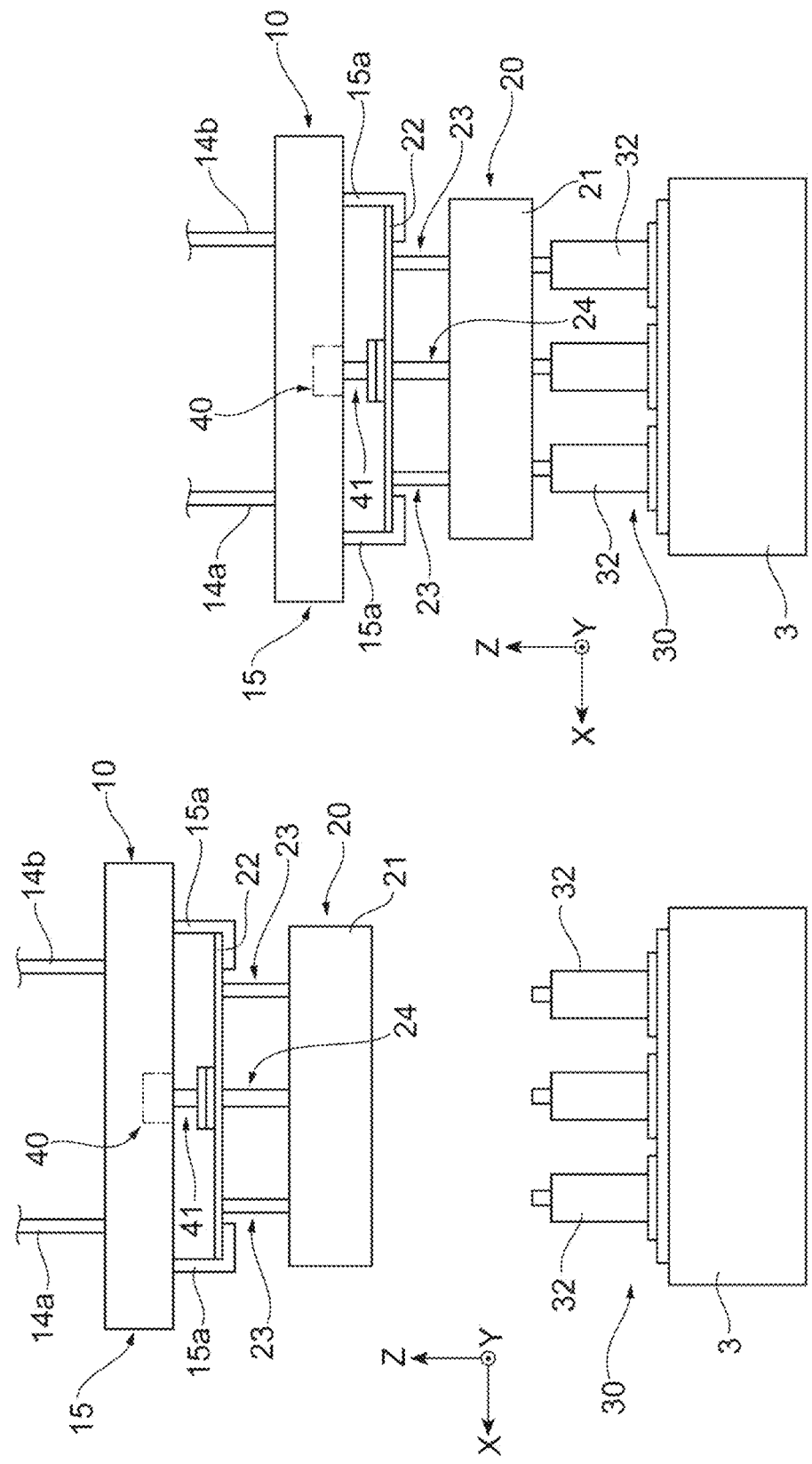

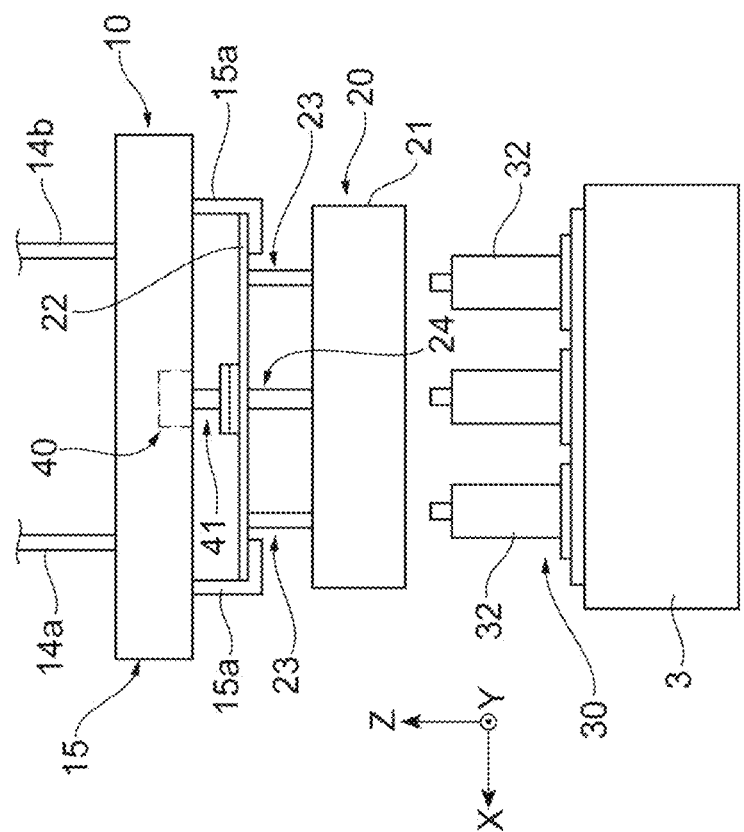
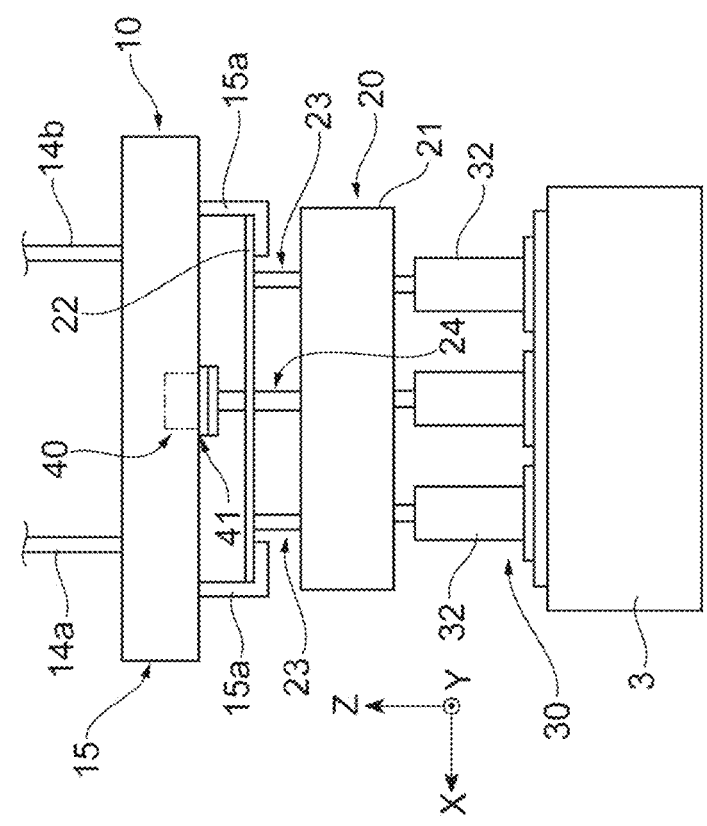

CEILING TRANSPORT VEHICLE SYSTEM AND TEACHING UNIT

BACKGROUND OF THE INVENTION

1. Field of the Invention

One aspect of the present invention relates to an overhead transport vehicle system and a teaching unit.

2. Description of the Related Art

A conventional overhead transport vehicle system, a system includes an overhead transport vehicle configured to convey a conveyed object, and a teaching unit used for teaching for transferring the conveyed object by the overhead transport vehicle to a transfer unit on which the conveyed object is to be placed (see Japanese Patent No. 3479969, for example). In this overhead transport vehicle system, a flange of the teaching unit is held by a holding unit configured to be raised and lowered by a lifting unit of the overhead transport vehicle. The teaching unit is provided with detection units, such as touch panels, configured to be brought into contact with positioning members of the transfer unit to detect the positions of the positioning members.

In the overhead transport vehicle system described above, when the detection units of the teaching unit are brought into contact with the positioning members during teaching, the teaching unit moves up and down due to, for example, an impact load applied by this contact, whereby the flange may be separated or displaced from the holding unit, for example. In this case, it is difficult to perform the teaching accurately.

SUMMARY OF THE INVENTION

Preferred embodiments of the present invention provide overhead transport vehicle systems and teaching units that enable teaching to be accurately performed with a flange of the teaching unit being stably held.

An overhead transport vehicle system according to one aspect of a preferred embodiment of the present invention includes an overhead transport vehicle to convey an object, and a teaching unit to teach transfer of the object by the overhead transport vehicle to a load port on which the object is to be placed. The teaching unit includes a body including a detector to be brought into contact with a positioning pin disposed on the load port to detect a position of the positioning pin, and a flange movable up and down with respect to the body and to be held by a holder to be raised and lowered by an elevator of the overhead transport vehicle.

In this overhead transport vehicle system, the flange is movable up and down with respect to the body. Thus, when the detector of the teaching unit is brought into contact with the positioning pin during teaching, even if an impact load is applied to the teaching unit due to the contact, the holder and the flange are prevented from being separated or displaced from each other. Consequently, teaching is able to be accurately performed with the flange of the teaching unit being stably held.

An overhead transport vehicle system according to one aspect of a preferred embodiment of the present invention may further include an operation detector to detect a lifting operation of the body relative to the holder in a state in which the flange is held by the holder, and a controller to recognize, based on a detection result of the operation detector, that the teaching unit has been placed on the positioning pin and the positioning pin is receiving the weight of the teaching unit. By this configuration, it is possible to recognize during teaching that the teaching unit has reached a state of being completely placed on the positioning pin (what is called a "teaching level").

In an overhead transport vehicle system according to one aspect of a preferred embodiment of the present invention, the operation detector may include a detected structure provided to the holder to be movable up and down and to be in contact with the body and ascend relative to the holder in conjunction with an ascent of the body, and a sensor to detect an ascent of the detected structure relative to the holder. In this case, the teaching level is able to be recognized with a simple configuration.

In an overhead transport vehicle system according to one aspect of a preferred embodiment of the present invention, the flange may be movable up and down with respect to the body within a certain range with a movable mechanism interposed therebetween. In this case, by using the movable mechanism, the configuration of the flange that is movable up and down with respect to the body is able to be specifically provided.

A teaching unit according to one aspect of a preferred embodiment of the present invention, in an overhead transport vehicle system including an overhead transport vehicle to convey an object, is a teaching unit used to teach transfer of the object by the overhead transport vehicle to a load port on which the object is to be placed. The teaching unit includes a body including a detector to be brought into contact with a positioning pin disposed on the load port to detect a position of the positioning pin, and a flange movable up and down with respect to the body and to be held by a holder to be raised and lowered by an elevator of the overhead transport vehicle.

In this teaching unit also, the flange is movable up and down with respect to the body. Thus, when the detector of the teaching unit is brought into contact with the positioning pin during teaching, even if an impact load is applied to the teaching unit due to the contact, the holder and the flange are prevented from being separated or displaced from each other. Consequently, teaching is able to be accurately performed with the flange of the teaching unit being stably held.

In a teaching unit according to one aspect of a preferred embodiment of the present invention, the overhead transport vehicle system may include an operation detector to detect a lifting operation of the body relative to the holder in a state in which the flange is held by the holder. The operation detector may include a detected structure provided to the holder to be movable up and down and to be in contact with the body and ascend relative to the holder in conjunction with ascent of the body, and a sensor to detect an ascent of the detected structure relative to the holder. The body is provided with a contact structure in a standing manner to contact with the detected structure of the operation detector. By this configuration, the contact structure is brought into contact with the detected structure of the operation detector during teaching, and thus a lifting operation of the body relative to the holder is able to be detected by the operation detector. Based on a detection result of the operation detector, it is possible to recognize during teaching that the teaching unit has reached the teaching level.

According to aspects of preferred embodiments of the present invention, overhead transport vehicle systems and teaching units are able to enable teaching to be accurately performed with a flange of the teaching unit being stably held.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a diagram illustrating an overhead transport vehicle system according to a preferred embodiment of the present invention.

FIG. 5A is a perspective view illustrating a movable mechanism when a flange is positioned at an upper limit position in the teaching unit in FIG. 1, and FIG. 5B is a perspective view illustrating the movable mechanism when the flange is positioned at a lower limit position in the teaching unit in FIG. 1.

FIG. 9A is a diagram for explaining teaching performed in the overhead transport vehicle system in FIG. 1, and FIG. 9B is a diagram illustrating a state subsequent to the state in FIG. 9A.

FIG. 10A is a diagram illustrating a state subsequent to the state in FIG. 9B, and FIG. 10B is a diagram illustrating a state subsequent to the state in FIG. 10A.

DETAILED DESCRIPTION OF THE PREFERRED EMBODIMENTS

Figure 2:
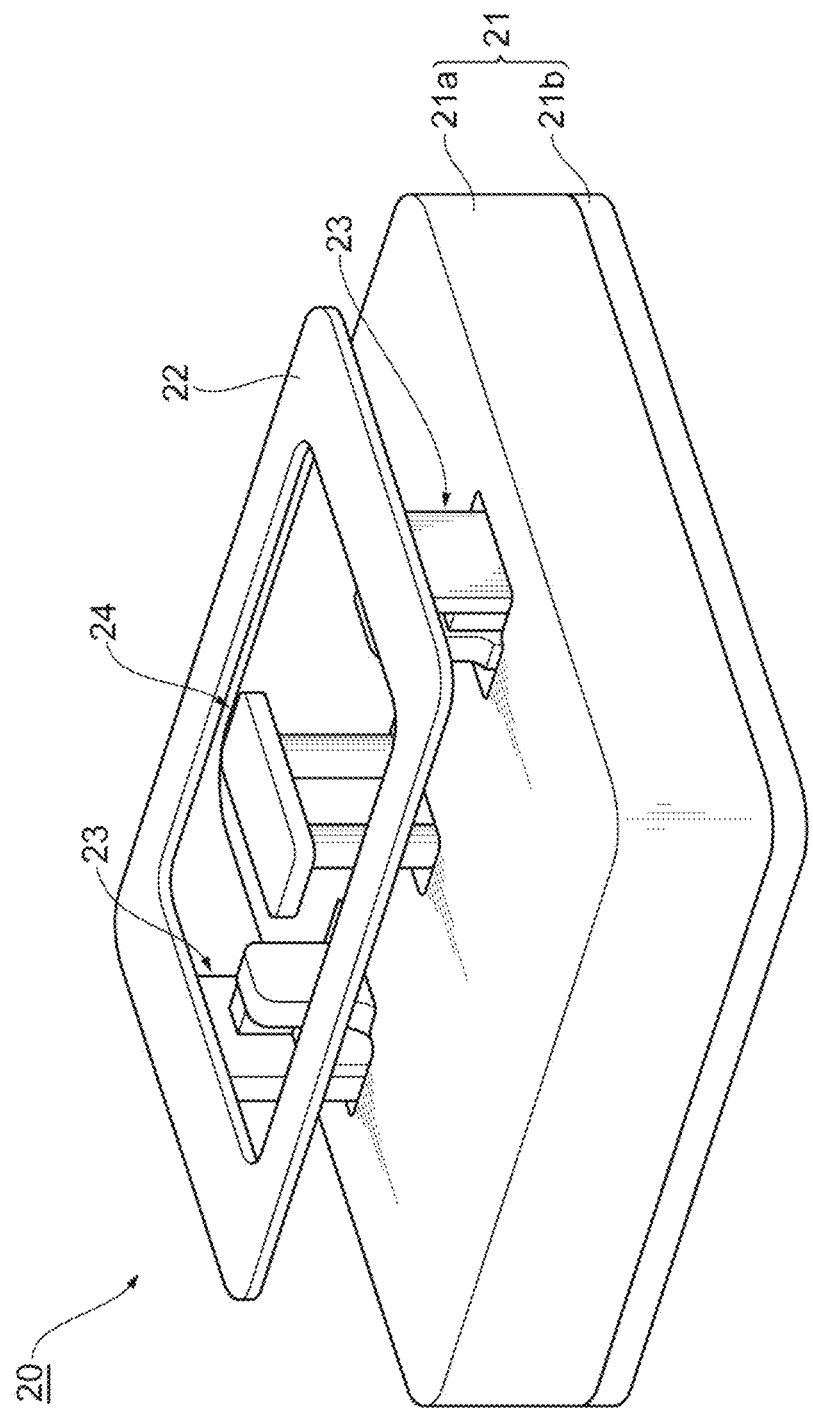
FIG. 2 is a perspective view of the teaching unit in FIG. 1 when viewed from above.

Preferred embodiments will now be described in detail with reference to the drawings. Like or equivalent elements are designated by like reference signs in each drawing, and duplicate description is omitted. The terms "up" and "down" correspond to the upper side and the lower side, respectively, in the vertical direction.

As illustrated in FIG. 1, an overhead transport vehicle system 1 includes a traveling rail 2 and an overhead transport vehicle 10. The traveling rail 2 is installed near a ceiling in a clean room where semiconductor devices are manufactured, for example. The overhead transport vehicle 10 travels along the traveling rail 2 to convey, for example, a reticle pod as a conveyed object, and also transfers the conveyed object at a load port (transfer unit) 3. The load port 3 is provided to a processing device configured to perform various processes on a semiconductor wafer, for example. Hereinafter, a direction parallel or substantially parallel to the traveling direction of the overhead transport vehicle 10 is defined as the X-direction, a direction parallel or substantially parallel to the horizontal plane and orthogonal or substantially orthogonal to the traveling direction of the overhead transport vehicle 10 is defined as the Y-direction, and a direction parallel or substantially parallel to the vertical direction is defined as the Z-direction.

The overhead transport vehicle 10 includes a traveling unit 11, a cross-feed unit 12, a rotating unit 13, a lifting unit 14, a holder 15, and a controller 16. The traveling unit 11 receives power supplied from a high-frequency current cable that is laid along the traveling rail 2 in a non-contact manner to travel along the traveling rail 2. The cross-feed unit 12 moves the rotating unit 13, the lifting unit 14, and the holder 15 in the Y-direction. The rotating unit 13 rotates the lifting unit 14 and the holder 15 in a horizontal plane. The lifting unit 14 pays out or winds a plurality of belts 14a to lower ends of which the holder 15 is attached, thus raising or lowering the holder 15 from or to the load port 3. The holder 15 includes a pair of claws 15a. The holder 15 opens or closes the pair of claws 15a, thus holding the conveyed object.

The controller 16 controls operation of each component of the overhead transport vehicle 10. The controller 16 controls operation of the overhead transport vehicle 10 on the basis of set transfer conditions, causing the overhead transport vehicle 10 to transfer a conveyed object to the load port 3. The transfer conditions are control parameters used to transfer the conveyed object to the load port 3. For example, the transfer conditions may include respective positions in the X-direction, the Y-direction, and the Z-direction of the holder 15 and a θ-direction position that is a position in a rotation direction in a horizontal plane of the holder 15 during transfer of a conveyed object to the load port 3. For example, the transfer conditions may include, during transfer of the conveyed object to the load port 3, the position of the traveling unit 11 in the X-direction (driven amount of the traveling unit 11), the positions of the rotating unit 13, the lifting unit 14, and the holder 15 in the Y-direction (driven amount of the cross-feed unit 12), the positions of the lifting unit 14 and the holder 15 in the θ direction (driven amount of the rotating unit 13), and the position of the holder 15 in the Z-direction (driven amount of the lifting unit 14). The transfer conditions are specified in the controller 16. The transfer conditions are not limited to particular ones, and may include other parameters.

In the overhead transport vehicle system 1, teaching for transfer conditions when a conveyed object is transferred to the load port 3 by the overhead transport vehicle 10 is performed. The teaching herein includes knowing how much the position of the holder is displaced from a target position when, in order for the overhead transport vehicle 10 to transfer a conveyed object at the load port 3, the traveling unit 11 has stopped at a predetermined position on the traveling rail 2 and the holder 15 has been lowered a predetermined distance, and causing the overhead transport vehicle 10 to store operations to be performed such that displacement from the target position is eliminated during operation of the overhead transport vehicle system 1. The overhead transport vehicle system 1 includes a teaching unit 20 and a target plate 30 that are used for the teaching.

Figure 3:
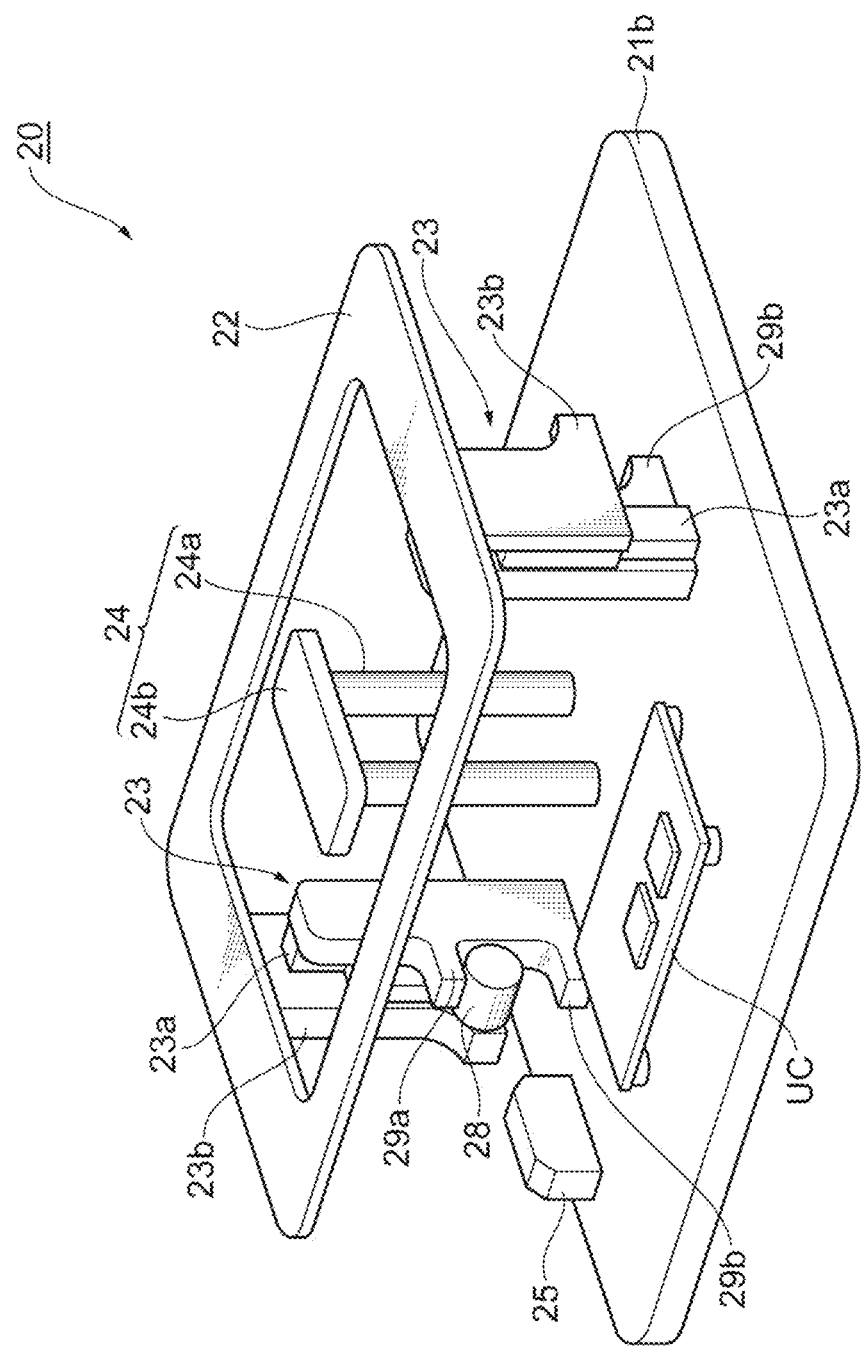
FIG. 3 is a perspective view illustrating inside of the teaching unit in FIG. 1.
Figure 4:
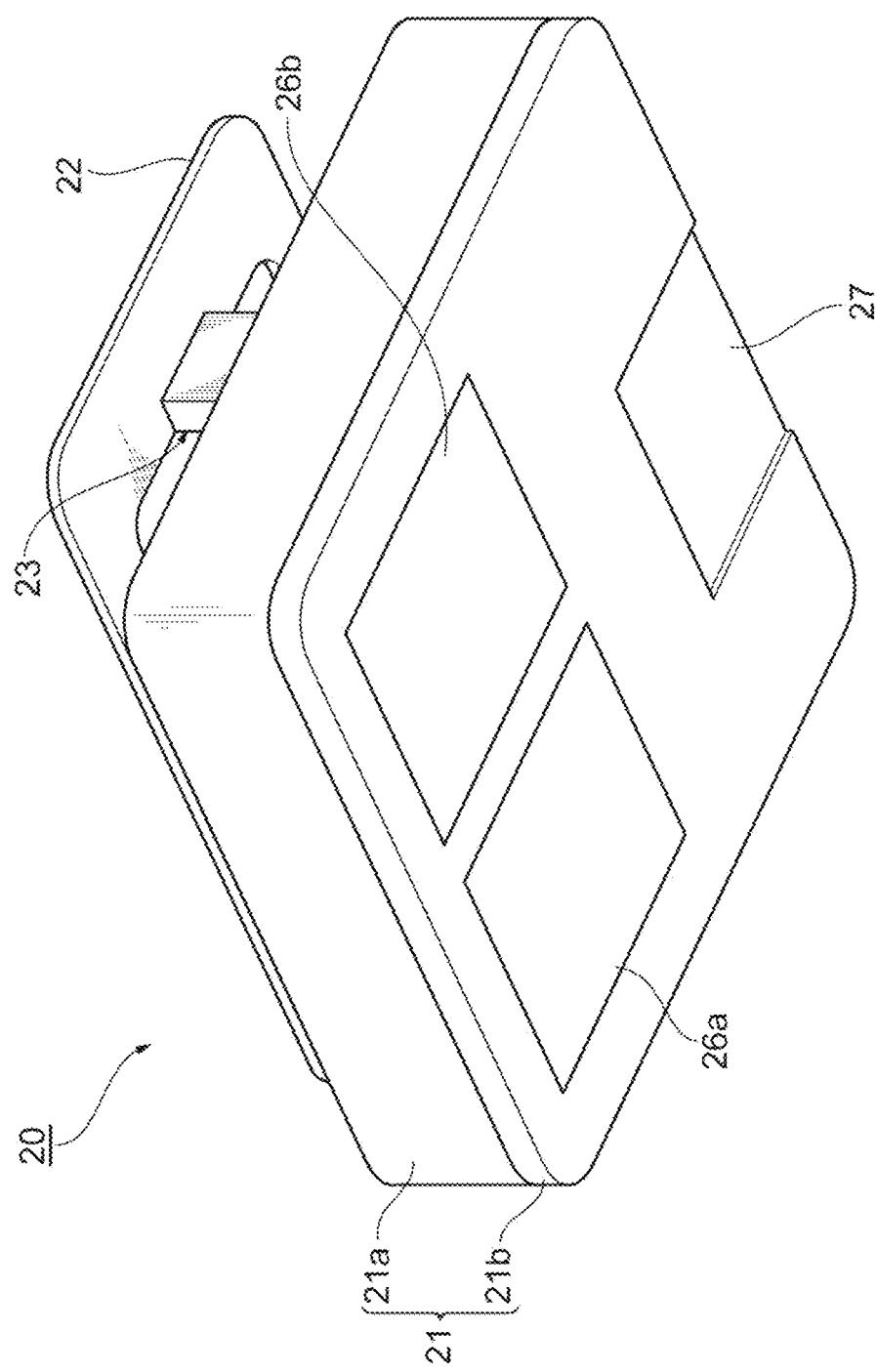
FIG. 4 is a perspective view of the teaching unit in FIG. 1 when viewed from below.

As illustrated in FIG. 2 to FIG. 4, the teaching unit 20 includes a unit body 21, a flange 22, movable mechanisms 23, a contact member 24, a deceleration start sensor 25, and a unit controller UC. The teaching unit 20 herein is a unit for a reticle pod. The teaching unit 20 preferably has a size equivalent to that of a reticle pod, for example.

The unit body 21 has an outer shape like a rectangular or substantially rectangular box. The unit body 21 includes a lid portion 21a and a bottom plate 21b. The lid portion 21a is attachable to and detachable from the bottom plate 21b. The unit body 21 includes touch panels (detectors) 26a and 26b that are arranged parallel or substantially parallel to each other on the lower surface of the bottom plate 21b. The touch panels 26a and 26b are brought into contact with tips of positioning pins 32 of the target plate 30 (see FIG. 1) disposed on the load port 3 to detect the positions of the positioning pins 32. The touch panels 26a and 26b each include a touch surface extending along the lower surface of the bottom plate 21b. On the lower surface of the bottom plate 21b, a recessed portion 27 that is recessed shallowly in a rectangular or substantially rectangular shape is a contact portion to be brought into contact with a positioning pin 32 different from the positioning pins 32 that come into contact with the touch panels 26a and 26b.

The flange 22 is held by the holder 15 configured to be raised or lowered by the lifting unit 14 of the overhead transport vehicle 10 (see FIG. 1). The flange 22 has a rectangular or substantially rectangular plate shape that is parallel or substantially parallel to the bottom plate 21b. The flange 22 is arranged in an upper central portion of the teaching unit 20. The flange 22 is fixed to the bottom plate 21b in a manner movable up and down within a certain range, with the movable mechanisms 23 interposed therebetween.

The movable mechanisms 23 are provided on one side and the other side in a predetermined direction on the bottom plate 21b. As illustrated in FIGS. 5A and 5B, each movable mechanism 23 is a linear guide mechanism including a rail 23a and a lifting block 23b. The rail 23a is installed on the bottom plate 21b in a standing manner. The lifting block 23b is raised and lowered along the rail 23a. The lifting block 23b is attached to the outer side of the rail 23a slidably along the longitudinal direction of the rail 23a. The lifting block 23b is fixed to the lower surface of the flange 22.

The rail 23a is provided with an upper restricting portion 29a and a lower restricting portion 29b that extend to a lateral side of the rail 23a (one side in the left-and-right direction of FIGS. 5A and 5B). The upper restricting portion 29a and the lower restricting portion 29b are spaced apart from each other by a certain length in the vertical direction. On a lower portion of the lifting block 23b, a stopper 28 protruding toward the inner side of the rail 23a is provided. The stopper 28 is positioned between the upper restricting portion 29a and the lower restricting portion 29b.

With this configuration, when the lifting block 23b has been raised along the rail 23a and the lifting block 23b has come into contact with the upper restricting portion 29a, a further ascent of the lifting block 23b is restricted such that the lifting block 23b is positioned at the upper limit position (see FIG. 5A). When the lifting block 23b has been lowered along the rail 23a and the lifting block 23b has come into contact with the lower restricting portion 29b, a further descent of the lifting block 23b is restricted, such that the lifting block 23b is positioned at the lower limit position (see FIG. 5B). With this movable mechanism 23, the flange 22 is able to be movable up and down with respect to the unit body 21 within a certain range corresponding to the certain length by which the upper restricting portion 29a and the lower restricting portion 29b are spaced apart from each other.

As illustrated in FIG. 3, the contact member 24 includes struts 24a and a unit-side contact portion 24b. The struts 24a are installed on a central portion of the bottom plate 21b in a standing manner. The unit-side contact portion 24b is a plate that is provided on tips of the struts 24a and the thickness direction of which corresponds to the axial direction of the struts 24a. The unit-side contact portion 24b is in contact with a detected member 41 described later (see FIG. 7).

As illustrated in FIG. 1 and FIG. 3, the deceleration start sensor 25 is a sensor configured to detect start timing to reduce the speed of the holder 15 when the holder 15 is lowered by the lifting unit 14 to move the teaching unit 20 toward the target plate 30. The deceleration start sensor 25 outputs an ON signal to the controller 16 when the distance to the target plate 30 has become equal to or shorter than a predetermined distance. As the deceleration start sensor 25, although not being limited to, various distance sensors may be used.

The unit controller UC is a controller configured or programmed to control various functions of the teaching unit 20. The unit controller UC outputs information on the positions of the positioning pins 32 detected by the touch panels 26a and 26b (see FIG. 4) to the controller 16.

Figure 6A:
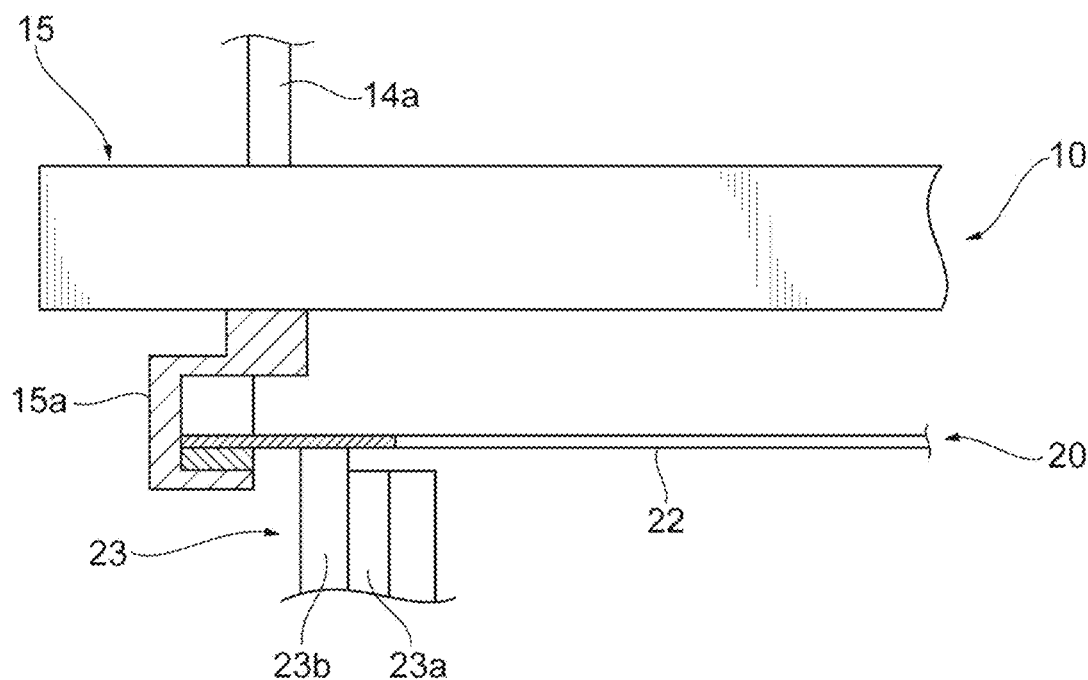
FIG. 6A is a sectional view for explaining a state in which the teaching unit is held under normal conditions.
Figure 6B:
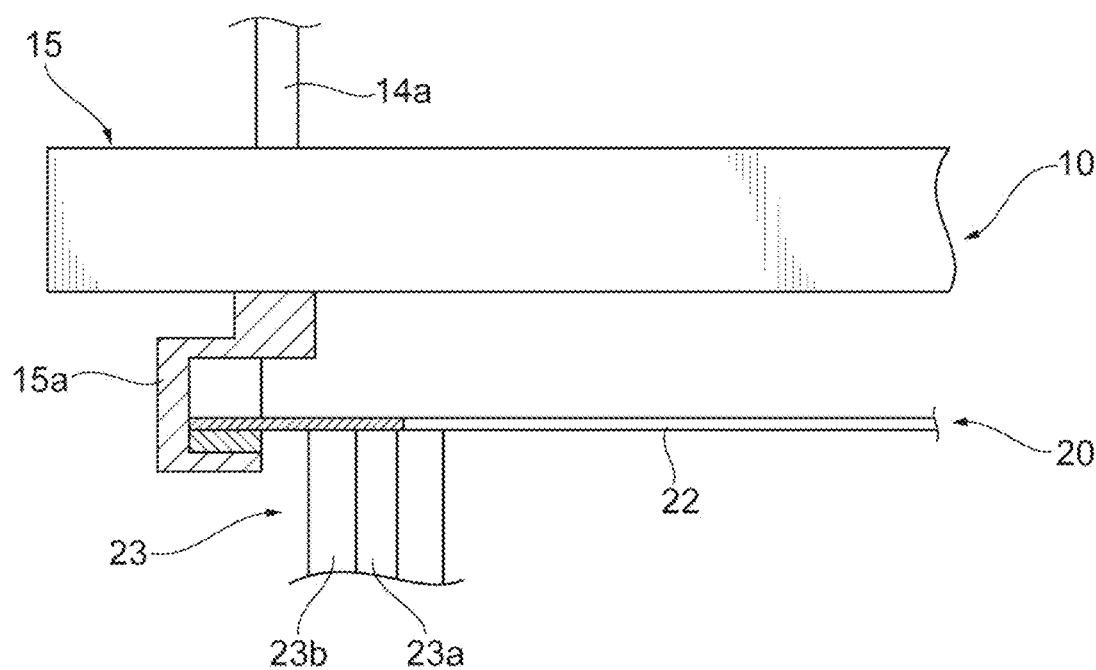
FIG. 6B is a sectional view for explaining a state in which the teaching unit is held when moving up and down.

As illustrated in FIG. 6A, the teaching unit 20 is held such that the outer peripheral portion of the flange 22 thereof is supported from below by the pair of claws 15a of the holder 15. Herein, even if the holder 15 moves up and down with respect to the teaching unit 20 due to some circumstances, the movable mechanisms 23 allow the flange 22 to ascend and descend in conjunction with this up-and-down movement. Consequently, as illustrated in FIG. 6B, the flange 22 is continuously in contact with the pair of claws 15a, and thus the state of being held by the holder 15 is maintained.

Figure 7:
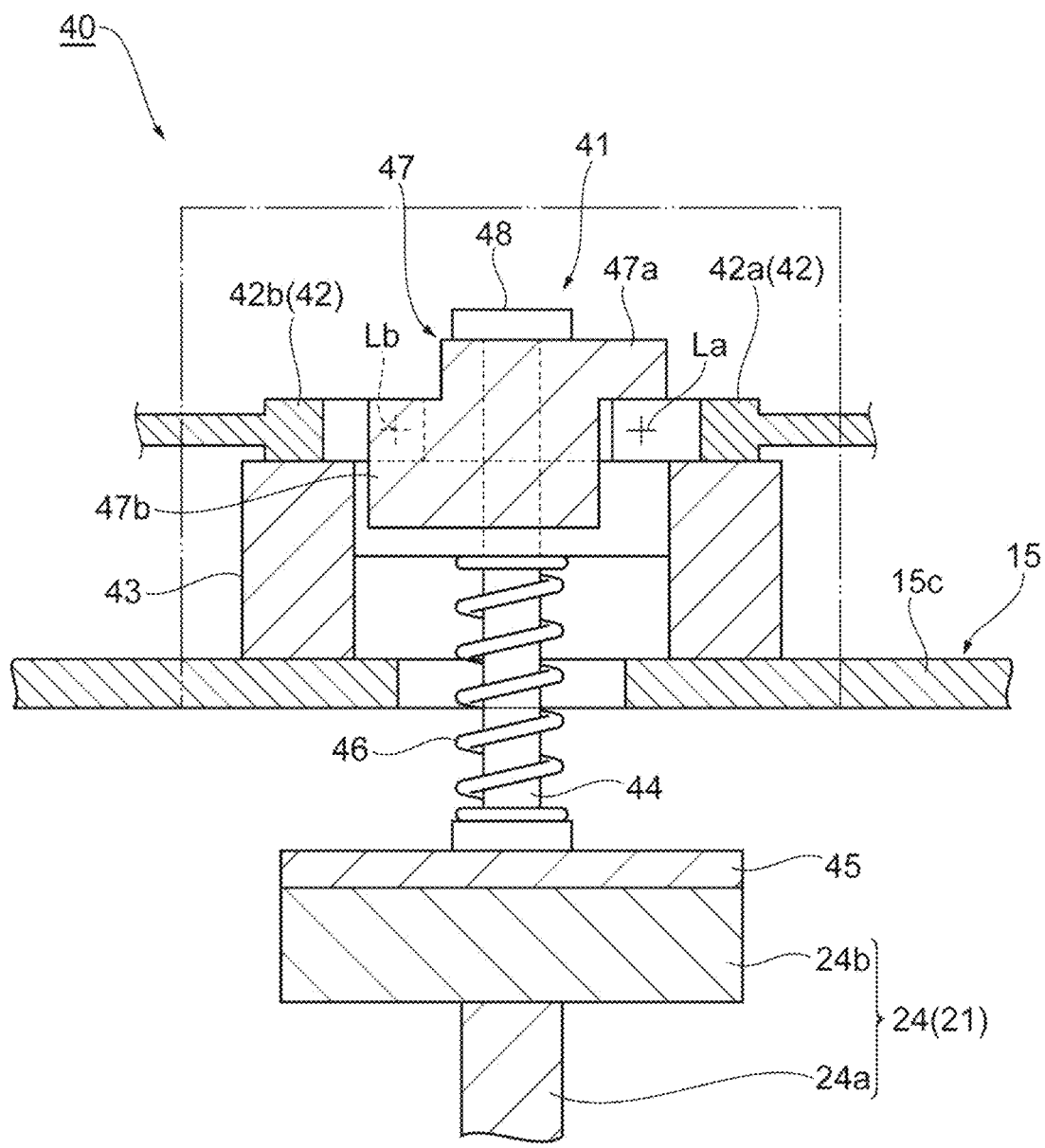
FIG. 7 is a sectional view illustrating an operation detector of the teaching unit in FIG. 1.

As illustrated in FIG. 7 and FIGS. 9A and 9B, the overhead transport vehicle 10 includes an operation detector 40. The operation detector 40 detects a lifting operation of the unit body 21 relative to the holder 15 in a state in which the flange 22 is held by the holder 15. The operation detector 40 includes a detected member 41 and a sensor 42.

The detected member 41 is movable up and down on a base 15c of the holder 15 with a support 43 interposed therebetween. The detected member 41 includes a rod 44, a gripper-side contact portion 45, a coil spring 46, and a dog 47. The rod 44 extends along the vertical direction to be disposed through the support 43. The gripper-side contact portion 45 is attached to the lower end of the rod 44. The gripper-side contact portion 45 is in contact with the unit-side contact portion 24b of the contact member 24 in the unit body 21. The coil spring 46 is disposed around the rod 44. The coil spring 46 biases the gripper-side contact portion 45 downward with respect to the support 43.

The dog 47 includes a first light-shielding plate 47a and a second light-shielding plate 47b. The first light-shielding plate 47a and the second light-shielding plate 47b are preferably integrally defined by a metal plate, for example. An upper end portion of the dog 47 is fixed to the upper end of the rod 44 to be integrated by a connector 48. The detected member 41 is in contact with the contact member 24 of the unit body 51, and ascends relative to the holder 15 in conjunction with the ascent of the unit body 51.

The sensor 42 detects the ascent of the detected member relative to the holder 15. The sensor 42 includes a first photo-interrupter 42a and a second photo-interrupter 42b. The first photo-interrupter 42a is attached to the support 43 so that the first light-shielding plate 47a can pass over an optical axis La thereof (between a light emitter and a light receiver of the first photo-interrupter 42a). With this configuration, the first photo-interrupter 42a is able to detect the position of the first light-shielding plate 47a. The second photo-interrupter 42b is attached to the support 43 so that the second light-shielding plate 47b can pass over an optical axis Lb thereof (between a light emitter and a light receiver of the second photo-interrupter 42b). With this configuration, the second photo-interrupter 42b is able to detect the position of the second light-shielding plate 47b. The optical axis La of the first photo-interrupter 42a and the optical axis Lb of the second photo-interrupter 42b are positioned at the same or substantially the same height (the same or substantially the same position in the vertical direction).

The first photo-interrupter 42a and the second photo-interrupter 42b of the sensor 42 are able to detect the positions of the first light-shielding plate 47a and the second light-shielding plate 47b, respectively. When the first photo-interrupter 42a has detected the first light-shielding plate 47a, its output changes from OFF to ON. When the second photo-interrupter 42b has detected the second light-shielding plate 47b, its output changes from OFF to ON. In other words, the sensor 42 detects the position of the dog 47, thus detecting lifting operation of the detected member 41 (the unit body 21 that is ganged with the detected member 41) relative to the holder 15. The sensor 42 outputs this detection result to the controller 16.

Referring back to FIG. 1, the overhead transport vehicle 10 includes a recognition unit 16a in the controller 16. Based on the detection result of the operation detector 40, the recognition unit 16a recognizes that the teaching unit 20 has been placed on the positioning pins 32 of the target plate 30 and the positioning pins 32 are receiving the weight of the teaching unit 20. Specifically, when the output of the second photo-interrupter 42b is ON, the recognition unit 16a recognizes that the teaching unit 20 has reached a state of being completely placed on the positioning pins 32 (what is called a "teaching level").

Figure 8:
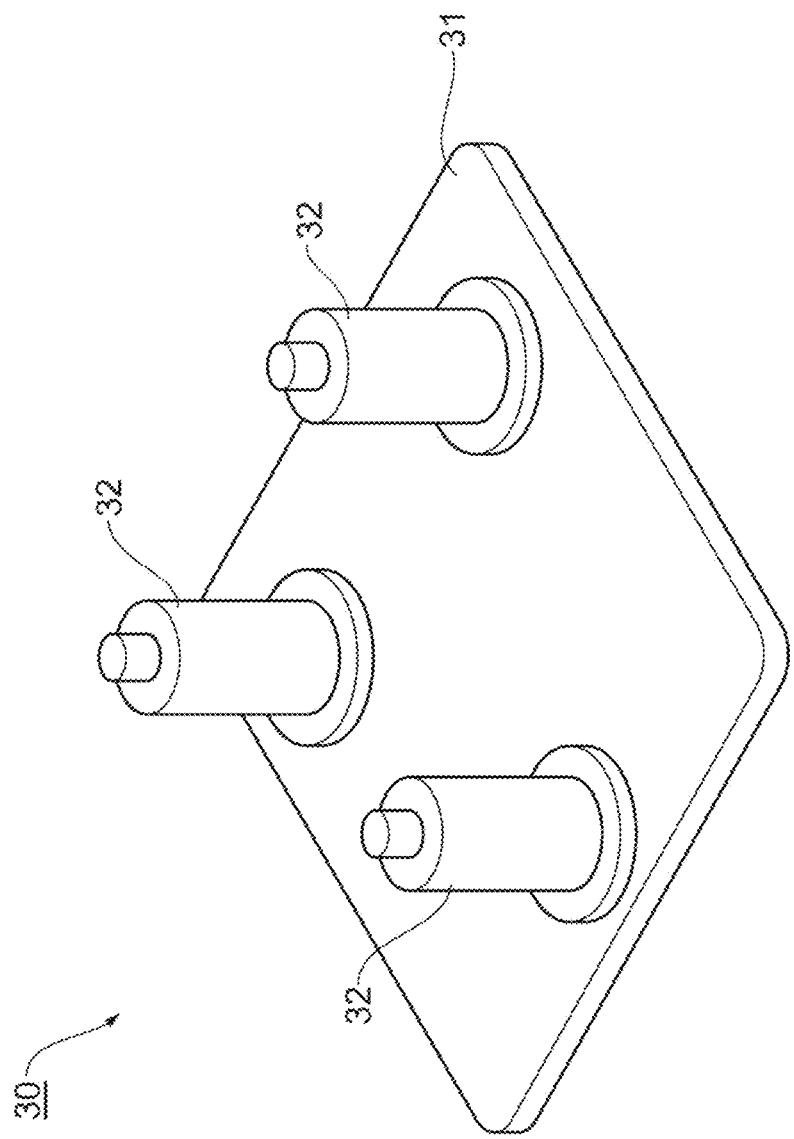
FIG. 8 is a perspective view illustrating a target plate in FIG. 1.

As illustrated in FIG. 8, the target plate 30 includes a base plate 31 and three positioning pins 32. The base plate 31 is attached to the load port 3 so as to be positioned on the load port 3. Each positioning pin 32 is a positioning member installed in a standing manner at a predetermined position on the base plate 31. These three positioning pins 32 are disposed in such a positional relation that two of them come into contact with the respective touch panels 26a and 26b (see FIG. 4) and the other one of them comes into contact with the recessed portion 27 (see FIG. 4).

In the overhead transport vehicle system 1 configured as described above, when teaching is performed, the teaching unit 20 is carried by the overhead transport vehicle 10 and the target plate 30 is disposed on the load port 3 as illustrated in FIG. 1 and FIG. 9A. At this time, the flange 22 is held by the holder 15, the detected member 41 of the operation detector 40 is in contact with the contact member 24 of the unit body 21. Based on the set transfer conditions, the traveling unit 11 is stopped at a predetermined position of the traveling rail 2, and the holder 15 is lowered a predetermined distance by the lifting unit 14. Thus, the teaching unit 20 is moved toward the positioning pins 32 of the target plate 30 on the load port 3.

When the distance between the teaching unit 20 and the target plate 30 has become equal to or shorter than the predetermined distance, an ON signal is output from the deceleration start sensor 25 to the controller 16, and accordingly the descending speed of the holder 15 is reduced. As illustrated in FIG. 9B, the teaching unit 20 is brought into contact with the positioning pins 32, and the teaching unit 20 is placed on the positioning pins 32.

As illustrated in FIG. 10A, when the holder 15 is continuously lowered, the detected member 41 that is in contact with the contact member 24 is pushed up. Thus, as illustrated in FIG. 7, the second light-shielding plate 47b of the dog 47 is raised to the optical axis Lb of the second photo-interrupter 42b, and the output of the second photo-interrupter 42b changes to ON. When the output of the second photo-interrupter 42b has changed to ON, the recognition unit 16a (see FIG. 1) recognizes that the teaching unit 20 has reached the teaching level. Subsequently, as illustrated in FIG. 10B, the holder 15 is raised by the lifting unit 14 until the teaching unit 20 is separated apart from the positioning pins 32.

Lowering and raising as described above are repeated a predetermined number of times, such that swinging of the teaching unit 20 is reduced.

Subsequently, the holder 15 is lowered, the touch panels 26a and 26b (see FIG. 4) of the teaching unit 20 are brought into contact with the positioning pins 32, and the positions of the positioning pins 32 are detected. After this detection of the positions has been repeatedly performed a plurality of times, transfer conditions or the amount of correction to the transfer conditions are acquired as teaching data based on the detection results.

As described above, in the overhead transport vehicle system 1 and the teaching unit 20, the flange 22 configured to be held by the holder 15 is movable up and down with respect to the unit body 21. Thus, when the touch panels 26a and 26b of the teaching unit 20 are brought into contact with the positioning pins 32, even if an impact load is applied to the teaching unit 20 due to the contact or even if the holder 15 moves up and down with respect to the teaching unit 20, the holder 15 and the flange 22 are able to be prevented from being separated or displaced from each other. Furthermore, the flange 22 is able to be prevented from getting caught by the holder 15. Consequently, teaching is able to be accurately performed with the flange 22 of the teaching unit 20 being stably held.

In the overhead transport vehicle system 1, the operation detector 40 detects a lifting operation of the unit body 21 relative to the holder 15 in a state in which the flange 22 is held by the holder 15. The recognition unit 16a recognizes, based on a detection result (whether the output of the second photo-interrupter 42b is ON) of the operation detector 40, that the teaching unit 20 has been placed on the positioning pins 32 and the positioning pins 32 are receiving the weight of the teaching unit 20. Thus, it is possible to recognize that the teaching unit has reached the teaching level, that is, a state of being completely placed on the positioning pins 32 during teaching.

In the overhead transport vehicle system 1, the operation detector 40 includes the detected member 41 provided to the holder 15 to be movable up and down, and the sensor 42 configured to detect ascent of the detected member 41 relative to the holder 15. The detected member 41 is in contact with the unit body 21, and also ascends relatively to the holder 15 in conjunction with ascent of the unit body 21. The sensor 42 detects the ascent of the detected member 41 relative to the holder 15. Thus, the teaching level is recognized with a simple configuration.

In the overhead transport vehicle system 1, the flange 22 is movable up and down with respect to the unit body 21 within a certain range with the movable mechanisms 23 interposed therebetween. Thus, by using the movable mechanism 23, the configuration of the flange 22 that is movable up and down with respect to the unit body 21 is able to be specifically provided.

In the teaching unit 20, the unit body 21 is provided with the contact member 24 in a standing manner. The contact member 24 is brought into contact with the detected member 41 of the operation detector 40 during teaching, and thus a lifting operation of the unit body 21 relative to the holder 15 is able to be detected by the operation detector 40. Consequently, based on a detection result of the operation detector 40, it is possible to recognize during teaching that the teaching unit 20 has reached the teaching level.

Herein, because the teaching unit 20 is a touch panel unit that detects the positions of the positioning pins 32 only with the touch panels 26a and 26b, the cost thereof is able to be reduced to be lower than those of a camera unit and a laser unit. The teaching unit 20 is for a reticle pod and the center of gravity of this reticle pod is located in its center, and thus also the overhead transport vehicle 10 is able to be made level. Consequently, in the present preferred embodiment, teaching for inclination (angle) with respect to the horizontal plane is able to be eliminated.

Although the preferred embodiments have been described above, the present invention is not limited thereto. In the preferred embodiments, the flange 22 preferably is provided to the unit body 21 with the movable mechanisms 23 interposed therebetween. However, the present invention is not limited to this. If the flange 22 is movable up and down with respect to the unit body 21, the flange 22 may be provided with various mechanisms or configurations interposed therebetween.

In the preferred embodiments, the configuration of the operation detector 40 is not limited to a particular one. For example, the operation detector 40 may detect a lifting operation of the unit body 21 relative to the holder 15 only with a set of the second light-shielding plate 47b and the second photo-interrupter 42b. In the preferred embodiments, the touch panels 26a and 26b are used as detectors. However, various detectors may be used instead if they can be brought into contact with the positioning pins 32 to detect the positions of the positioning pins 32.

In the preferred embodiments, the teaching unit 20 is a unit for a reticle pod. However, the present invention is not limited to this. If teaching for inclination (angle) with respect to the horizontal plane is not required, the teaching unit 20 may be a unit for a front opening unified pod (FOUP).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle system comprising:
   an overhead transport vehicle to convey an object; and
   a teaching unit to teach transfer of the object by the overhead transport vehicle to a load port on which the object is to be placed; wherein
   the teaching unit includes:
      a body including a detector to be brought into contact with a positioning pin disposed on the load port to detect a position of the positioning pin; and
      a flange movable up and down with respect to the body and to be held by a holder to be raised and lowered by an elevator of the overhead transport vehicle.

2. The overhead transport vehicle system according to claim 1, further comprising:
   an operation detector to detect a lifting operation of the body relative to the holder in a state in which the flange is held by the holder; and
   a controller to recognize, based on a detection result of the operation detector, that the teaching unit has been placed on the positioning pin and the positioning pin is receiving the weight of the teaching unit.

3. The overhead transport vehicle system according to claim 2, wherein the operation detector includes:
   a detected structure provided to the holder to be movable up and down and to be in contact with the body and ascend relative to the holder in conjunction with an ascent of the body; and
   a sensor to detect an ascent of the detected structure relative to the holder.

4. The overhead transport vehicle system according to claim 1, wherein the flange is movable up and down with respect to the body within a certain range with a movable mechanism interposed therebetween.

5. A teaching unit in an overhead transport vehicle system including an overhead transport vehicle to convey an object, the teaching unit being used to teach transfer of the object by the overhead transport vehicle to a load port on which the object is to be placed, the teaching unit comprising:
   a body including a detector to be brought into contact with a positioning pin disposed on the load port to detect a position of the positioning pin; and
   a flange movable up and down with respect to the body and to be held by a holder to be raised and lowered by an elevator of the overhead transport vehicle.

6. The teaching unit according claim 5, wherein
   the overhead transport vehicle system includes an operation detector to detect a lifting operation of the body relative to the holder in a state in which the flange is held by the holder;
   the operation detector includes:
      a detected structure provided to the holder to be movable up and down and to be in contact with the body and ascend relative to the holder in conjunction with an ascent of the body; and
      a sensor to detect an ascent of the detected structure relative to the holder; and
   the body is provided with a contact structure in a standing manner to contact with the detected structure of the operation detector.

7. The overhead transport vehicle system according to claim 2, wherein the flange is movable up and down with respect to the body within a certain range with a movable mechanism interposed therebetween.

8. The overhead transport vehicle system according to claim 3, wherein the flange is movable up and down with respect to the body within a certain range with a movable mechanism interposed therebetween.

* * * * *